United States Patent
Enzinna

(10) Patent No.: US 12,019,099 B2
(45) Date of Patent: *Jun. 25, 2024

(54) HIGH SIDE CURRENT MONITOR

(71) Applicant: Advanced Energy Industries, Inc., Denver, CO (US)

(72) Inventor: Donald Enzinna, Lockport, NY (US)

(73) Assignee: Advanced Energy Industries, Inc., Denver, CO (US)

( * ) Notice: Subject to any disclaimer, the term of this patent is extended or adjusted under 35 U.S.C. 154(b) by 201 days.

This patent is subject to a terminal disclaimer.

(21) Appl. No.: 17/676,885

(22) Filed: Feb. 22, 2022

(65) Prior Publication Data

US 2022/0244294 A1    Aug. 4, 2022

Related U.S. Application Data

(63) Continuation of application No. 16/901,746, filed on Jun. 15, 2020, now Pat. No. 11,280,811.

(60) Provisional application No. 62/862,459, filed on Jun. 17, 2019.

(51) Int. Cl.
    G01R 15/14      (2006.01)
    G01R 15/20      (2006.01)

(52) U.S. Cl.
    CPC ......... G01R 15/146 (2013.01); G01R 15/202 (2013.01)

(58) Field of Classification Search
    CPC ............... G01R 15/146; G01R 15/202; G01R 27/2605; G01R 31/52; G01R 15/14; G01R 19/0092; G01R 23/165; H01L 21/6833; H01J 37/32009
    USPC ...................................... 324/123, 76.11, 500
    See application file for complete search history.

(56) References Cited

U.S. PATENT DOCUMENTS

| | | | |
|---|---|---|---|
| 3,913,015 A | 10/1975 | Bronaugh | |
| 4,876,534 A | 10/1989 | Mead et al. | |
| 5,017,871 A | 5/1991 | Mueller et al. | |
| 9,322,850 B2 * | 4/2016 | Wood | G01R 1/203 |

(Continued)

FOREIGN PATENT DOCUMENTS

| | | |
|---|---|---|
| AU | 2011267897 B2 | 12/2015 |
| EP | 1418668 A1 | 5/2004 |
| JP | H08256027 A | 10/1996 |

OTHER PUBLICATIONS

Miki Kobayashi, "International Preliminary Report On Patentability Regarding Application No. PCT/US2020/037838", dated Dec. 30, 2021, p. 9, Published in: AU.

(Continued)

*Primary Examiner* — Giovanni Astacio-Oquendo
(74) *Attorney, Agent, or Firm* — Neugeboren O'Dowd PC

(57) ABSTRACT

Systems, methods, and an apparatus for current monitoring are disclosed. A current monitor comprises a high-voltage side configured to obtain a signal indicative of current through a conductor and apply different levels of gain to different frequency bands of the signal to produce an adjusted signal. A low-voltage side of the current monitor is electrically isolated from the high-voltage side and is configured to split the adjusted signal to produce a plurality of output signals that are each indicative of a level of current at one of the different frequency bands. An isolation amplifier is configured to communicate the adjusted signal from the high-voltage side to the low-voltage side while electrically isolating the high-voltage side from the low-voltage side.

19 Claims, 4 Drawing Sheets

(56) References Cited

U.S. PATENT DOCUMENTS

| | | |
|---|---|---|
| 11,280,811 B2 | 3/2022 | Enzinna |
| 2002/0004186 A1 | 1/2002 | Lochschmied |
| 2010/0008016 A1 | 1/2010 | Onate et al. |
| 2010/0231229 A1* | 9/2010 | Harris .................... G01R 31/52 324/547 |
| 2011/0032654 A1 | 2/2011 | McAnn et al. |
| 2013/0003250 A1 | 1/2013 | Morimoto et al. |
| 2013/0257048 A1 | 10/2013 | Neddermeyer, III et al. |
| 2016/0303983 A1 | 10/2016 | Rotay et al. |
| 2017/0108540 A1 | 4/2017 | Davis et al. |
| 2017/0334295 A1* | 11/2017 | Turner ................. G01R 27/025 |
| 2020/0400719 A1* | 12/2020 | Enzinna ............... G01R 15/146 |
| 2020/0403397 A1 | 12/2020 | Nakagawa et al. |
| 2021/0028713 A1 | 1/2021 | Iyer et al. |
| 2021/0237610 A1 | 8/2021 | Zheng |
| 2021/0245622 A1 | 8/2021 | Wang |
| 2022/0283200 A1* | 9/2022 | Friedrich ............. G01R 15/202 |

OTHER PUBLICATIONS

Thanabalasingham, Thayaparan, "International Search Report and Written Opinion Regarding International Application No. PCT/US2020/037838", dated Aug. 14, 2020, p. 13, Published in: AU.

Astacio-Oquendo, Giovanni, "Office Action Regarding U.S. Appl. No. 16/901,746", May 27, 2021, p. 36, Published in: US.

Thomas Agerbaek, Supplementary European Search Report, dated Jun. 16, 2023, European Patent Office.

* cited by examiner

HIGH SIDE CURRENT MONITOR

CLAIM OF PRIORITY UNDER 35 U.S.C. § 120

The present Application for Patent is a Continuation of patent application Ser. No. 16/901,746 entitled "HIGH SIDE CURRENT MONITOR" filed Jun. 15, 2020, pending, which claims priority to Provisional Application No. 62/862,459 entitled "HIGH SIDE CURRENT MONITOR" filed Jun. 17, 2019 and assigned to the assignee hereof and hereby expressly incorporated by reference herein.

BACKGROUND

Field

The present invention relates generally to monitoring power, and more particularly, to a method and apparatus for monitoring current provided to a load.

Background

Monitoring current is important in many contexts. For example, electrostatic chucks are used to support workpieces (e.g., wafers) in a variety of processing systems. In a deposition system, for example, an electrostatic chuck may be used to clamp a wafer in place while a thin film is deposited on the wafer. In an etch system, as another example, an electrostatic chuck may be used to clamp a wafer in place while material is being chemically etched from the wafer.

Electrostatic chucks use electrostatic force to hold the workpiece in place. An electrostatic chuck has electrodes that are energized with a clamping voltage, which electrostatically clamps the workpiece to the surface of the electrostatic chuck. The electrodes in the electrostatic chuck are coupled to an electrostatic power supply and a controller. The electrostatic power supply receives the control signal from the controller and generates a clamping voltage adapted to clamp the substrate with a clamping force.

Proper positioning of the workpiece relative to the electrostatic chuck is important at various times before, during, and after typical workpiece processes. For example, it is important to ensure that a workpiece is properly loaded onto the electrostatic chuck before applying the clamping voltage. As another example, it may be desirable to determine whether the workpiece is clamped or unclamped at certain times.

The electrostatic power supply may include a direct current (DC) voltage generator configured to generate a DC clamping voltage for the clamping electrode assembly of the electrostatic chuck and an alternating current (AC) voltage generator configured to generate an AC signal. The position of the workpiece may be detected by monitoring a capacitance of a combination of the workpiece and the electrostatic chuck. For example, when the workpiece is properly positioned on the electrostatic chuck, the sensed capacitance may be higher than when the workpiece is not properly positioned.

The varying level of current provided to the electrostatic chuck (in response to the application of the AC voltage) enables the capacitance of the electrostatic chuck to be monitored, and as a consequence, the position of the workpiece may be monitored by monitoring the current provided to the electrostatic chuck.

Prior art approaches to monitoring current typically utilize a shunt resistor on a return side (between the electrostatic chuck and ground) of the electrostatic chuck power supply because the output side needs to operate in the range of thousands of volts. Low side sensing avoids the problems of isolating the high voltage from the measurement output but often at the expense of noise. High side current sensing avoids the problem of noise but requires a means of isolation. Isolation amplifiers are available that can separate the high voltage output of the electrostatic chuck power supply from the measured signal, but unfortunately, isolation amplifiers typically have a lot of electrical noise that limits the lowest possible resolution of the system.

As processing techniques continue to move to higher power amplifiers with higher output currents, there is need to scale current measurement systems to fit a larger signal by reducing gain. When the current monitor is also used for capacitance sensing, reducing gain drives the relatively small capacitance signal below the noise floor. This causes an unacceptable reduction in the resolution of capacitance measurement abilities. As a consequence, prior art approaches to monitoring current are undesirable and will almost certainly be unacceptable in the future.

SUMMARY

An aspect may be characterized as a current monitor that includes a high-voltage side configured to obtain a signal indicative of current through a conductor and apply different levels of gain to different frequency bands of the signal to produce an adjusted signal. A low-voltage side is electrically isolated from the high-voltage side and configured to split the adjusted signal to produce a plurality of output signals wherein each of the plurality of output signals is indicative of a level of current at one of the different frequency bands. An isolation amplifier is configured to communicate the adjusted signal from the high-voltage side to the low-voltage side while electrically isolating the high-voltage side from the low-voltage side.

Another aspect is a method for monitoring current that comprises obtaining a signal indicative of current through a conductor, splitting the signal into at least two frequency bands to obtain at least two high-voltage-side signals, and separately applying gain to each of the at least two high-voltage-side signals. The at least two high-voltage-side signals are combined to produce an adjusted signal that is communicated to a low-voltage-side via a galvanically isolated path. The adjusted signal is split on the low-voltage-side into at least two frequency bands to obtain at least two output signals, and one or more of the at least two output signals is used to monitor the current in the conductor.

Yet another aspect is a system for current monitoring comprising a power supply configured to apply a voltage to an electrostatic chuck that includes a direct current (DC) component and an alternating current (AC) component. The system also comprises a current monitor that comprises means for obtaining a signal indicative of current through a conductor that couples the power supply to the electrostatic chuck. The system also comprises means for splitting the signal into at least two frequency bands to obtain at least two high-voltage-side signals, means for separately applying gain to each of the at least two high-voltage-side signals, and means for combining the at least two high-voltage-side signals to produce an adjusted signal. In addition, the system comprises means for communicating the adjusted signal to a low-voltage-side via a galvanically isolated path, and the low-voltage-side comprises means for splitting the adjusted signal on the low-voltage-side into at least two frequency bands to obtain at least two output signals. The system also comprises means for using one or more of the at least two output signals to monitor the current in the conductor.

DETAILED DESCRIPTION

The word "exemplary" is used herein to mean "serving as an example, instance, or illustration." Any embodiment described herein as "exemplary" is not necessarily to be construed as preferred or advantageous over other embodiments.

Figure 1:
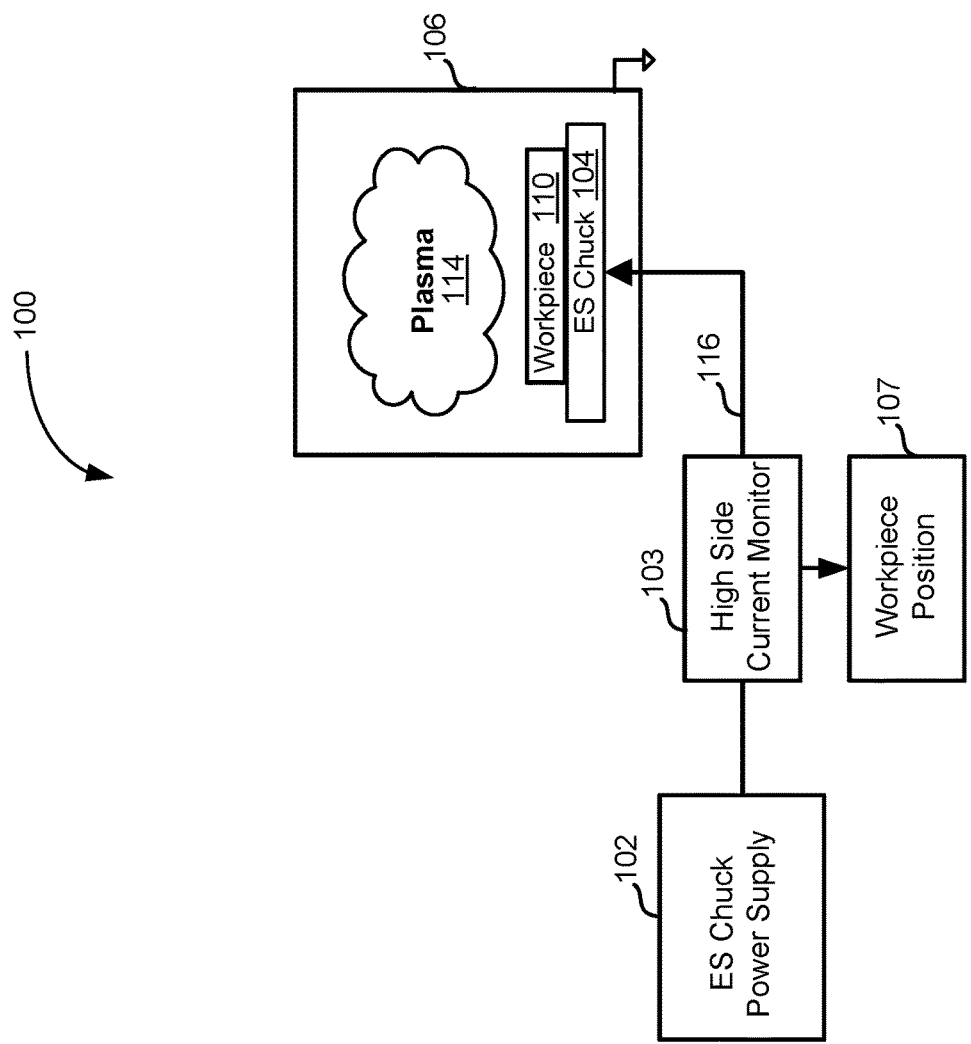
FIG. 1 illustrates a block diagram depicting an exemplary environment in which a high side current monitor may be utilized.

Referring first to FIG. 1, shown is an exemplary electrostatic chucking system 100, which is one environment in which embodiments of high side current monitors disclosed herein may be utilized. As depicted, the electrostatic chucking system 100 includes an electrostatic chuck power supply 102, a high side current monitor 103, and an electrostatic chuck 104. As shown, the electrostatic chuck 104 is positioned within a plasma processing chamber 106, and a workpiece 110 is shown clamped to the electrostatic chuck 104. Also shown is a workpiece position module 107 that is configured to provide an indication of a position of the workpiece 110 based upon current measured by the high side current monitor 103.

In this exemplary application, the plasma processing chamber 106 may be realized by chambers of substantially conventional construction (e.g., including a vacuum enclosure which is evacuated by a pump or pumps (not shown)). And, as one of ordinary skill in the art will appreciate, the plasma excitation in the plasma processing chamber 106 may be achieved by any one of a variety of sources including, for example, a helicon type plasma source, which includes magnetic coil and antenna to ignite and sustain a plasma 114 in the reactor, and a gas inlet may be provided for introduction of a gas into the plasma processing chamber 106.

As depicted, the workpiece 110 to be treated (e.g., a semiconductor wafer), is supported at least in part by the electrostatic chuck 104, and power is applied to the electrostatic chuck 104 via one or more conductors (e.g., cables). For simplicity only a single conductor 116 is shown coupled the electrostatic chuck 104, but it should be recognized that aspects described herein are applicable to monopolar chucks and multipolar chucks. As an example, those of ordinary skill in the art will appreciate that six power lines and six corresponding high side current monitors may be employed in connection with a hexapolar electrostatic chuck.

The electrostatic chuck power supply 102 may be realized by any of a variety of known, or yet to be developed, power supplies that are capable of applying a voltage that includes DC and AC components. For example, the electrostatic chuck power supply 102 may be capable of applying 1000 volts DC and 10 to 20 volts AC (peak-to-peak) at 1 kHz, but these voltages and frequency are exemplary only and may vary depending upon the many factors. As discussed above, the DC voltage effectuates a DC clamping voltage at the electrostatic chuck 104 that draws the workpiece 110 to the electrostatic chuck while the AC voltage may be utilized to detect a position of the workpiece 110 relative to the electrostatic chuck 104.

Figure 2:
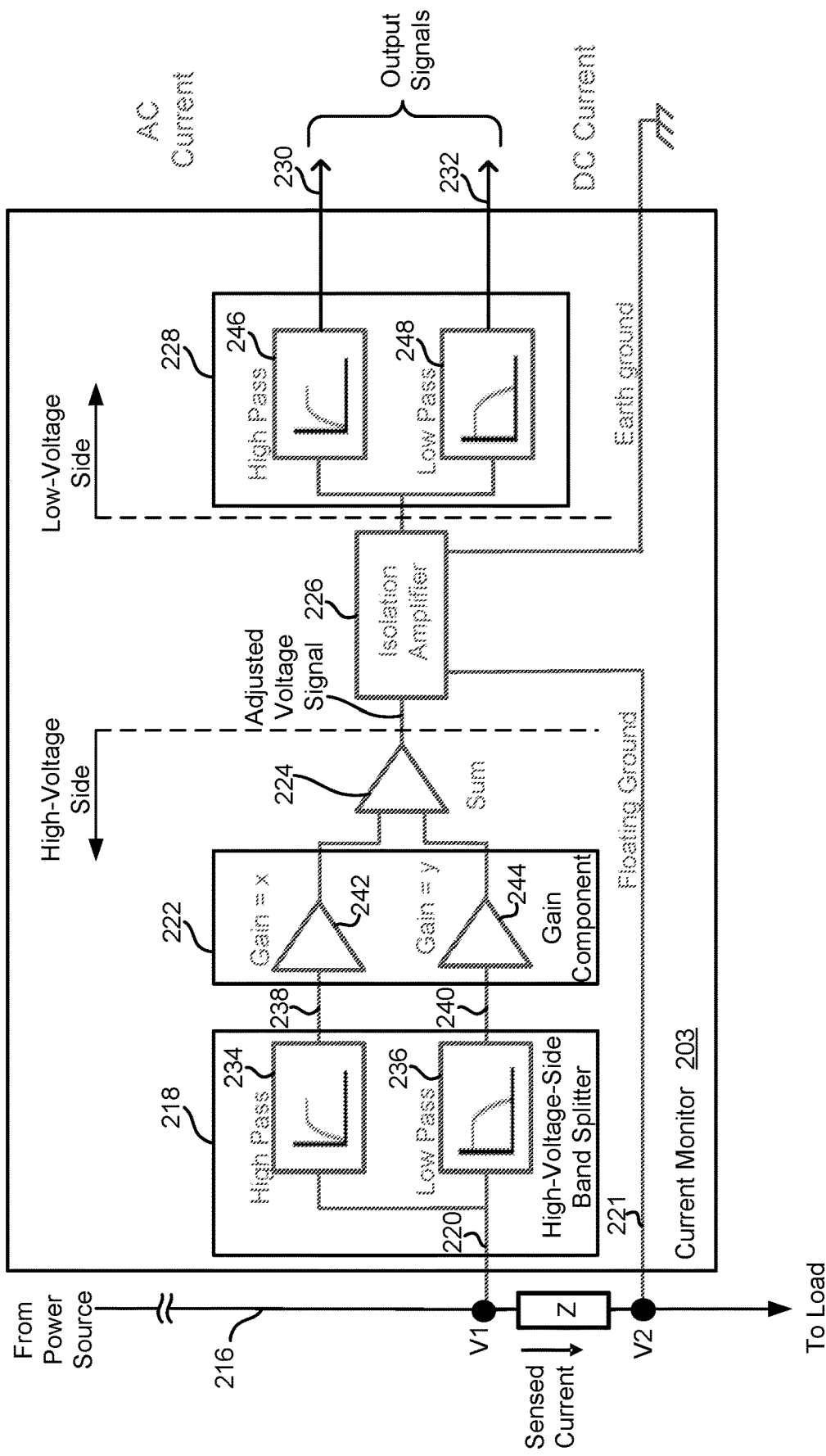
FIG. 2 is a block diagram depicting an exemplary embodiment of the high side current monitor depicted in FIG. 1.

Referring next to FIG. 2, shown is an exemplary high side current monitor 203 that may be used to realize the high side current monitor 103 shown in FIG. 1. As shown, a shunt impedance, Z, is disposed along a conduction path that includes a conductor 216 that couples a power source such as the electrostatic chuck power supply 102 to a node, v1, on one side of the shunt impedance, Z. The conduction path also includes the shunt impedance, Z, and another portion of the conductor 216 that couples another side of the shunt impedance, Z, at node v2 to the electrostatic chuck 104. Thus, the shunt impedance, Z, is disposed in a current path from a power source (e.g., the electrostatic chuck power supply 102) to a load (e.g., the electrostatic chuck 104). As a consequence, the voltage across the shunt impedance, Z, (between nodes v1 and v2) varies with the current provided to the electrostatic chuck 104; thus, the voltage between nodes v1 and v2 may be used as a signal that is indicative of the current provided to the electrical load (e.g., the electrostatic chuck 104). As shown, a first lead 220 is coupled to the node v1 and a second lead 221 is coupled to the node v2. Thus, the signal (indicative of the current) in obtained in the embodiment of FIG. 2 by coupling the leads 220, 221 across the shunt impedance, Z, positioned in a current path of the conductor 216. As discussed above, the voltage applied to v1 may be about 1000 VDC and the voltage at v2 is a floating ground, which is a local reference that varies with the output voltage of a power source (such as the electrostatic chuck power supply 102). For example, the floating ground at v2 may be about 1 volt different than the voltage applied at node v1.

In general, the shunt impedance, Z, is a complex quantity that includes resistive and reactive components, but in many implementations, the shunt impedance, Z, may be implemented as a resistor with a reactance that is substantially zero. As an example, without limitation, the shunt impedance, Z, may be realized by a 100-ohm resistor, and a full-scale current through the shunt impedance, Z, may be 10 milliamps. As a consequence, the voltage across the shunt impedance, Z, may be about 1 volt or less. Because the voltage differential between v1 and v2 is due to the current, a positive voltage at v1 relative to v2 indicates current is going into the electrostatic chuck 104.

It should be recognized that the shunt impedance, Z, is only one way to sense and obtain a signal indicative of current through the conductor 216 and that there are several other ways to sense current such as, for example, Hall effect sensors, fluxgate sensors, and transformers.

As shown, the node, v1, is coupled to a high-voltage-side band splitter 218 via the lead 220, and the high-voltage-side band splitter 218 is coupled to a gain component 222, which is coupled to a summer 224. The output of the summer 224 is coupled to a high-voltage side of an isolation amplifier 226, and a low-voltage side of the isolation amplifier 226 is coupled to a low-voltage-side band splitter 228, which provides a plurality of output signals including first output signal 230 and a second output signal 232. It should be recognized that the depicted components are intended to convey logical functions and that the functions may be implemented by common underlying physical components or effectuated by a distribution of physical components. For example, a filter and gain amplifier may be implemented by a common operational amplifier (op-amp) or may be implemented by separate physical components. It should also be recognized that the depicted functions may be implemented by hardware or a combination of hardware and software.

In general, the isolation amplifier 226 functions to galvanically isolate the high-voltage side of the current monitor 203 from the low-voltage side of the current monitor 203 while allowing signal information to be passed across a barrier without any ohmic path between input and output.

Isolation can be implemented using an all-analog isolation amplifier. Alternatively, a subcircuit comprised of a non-isolated amplifier followed by an analog-to-digital converter and isolator (which may use optical, capacitive, magnetic principles) may be utilized. An isolated power supply that is independent of the electrostatic chuck power supply 102 may be used to power the components of the isolation amplifier. As a specific example, the isolation amplifier 226 may be realized by an isolation amplifier identified by part No. ISO224ADWVR sold by Texas Instruments, Inc, which may be powered by an isolated power supply identified by part No. NMS0515C sold by Murata Manufacturing Co., Ltd., but it should be recognized that other parts from other sources may be utilized to realize, and provide power to, the isolation amplifier 226.

Figure 3:
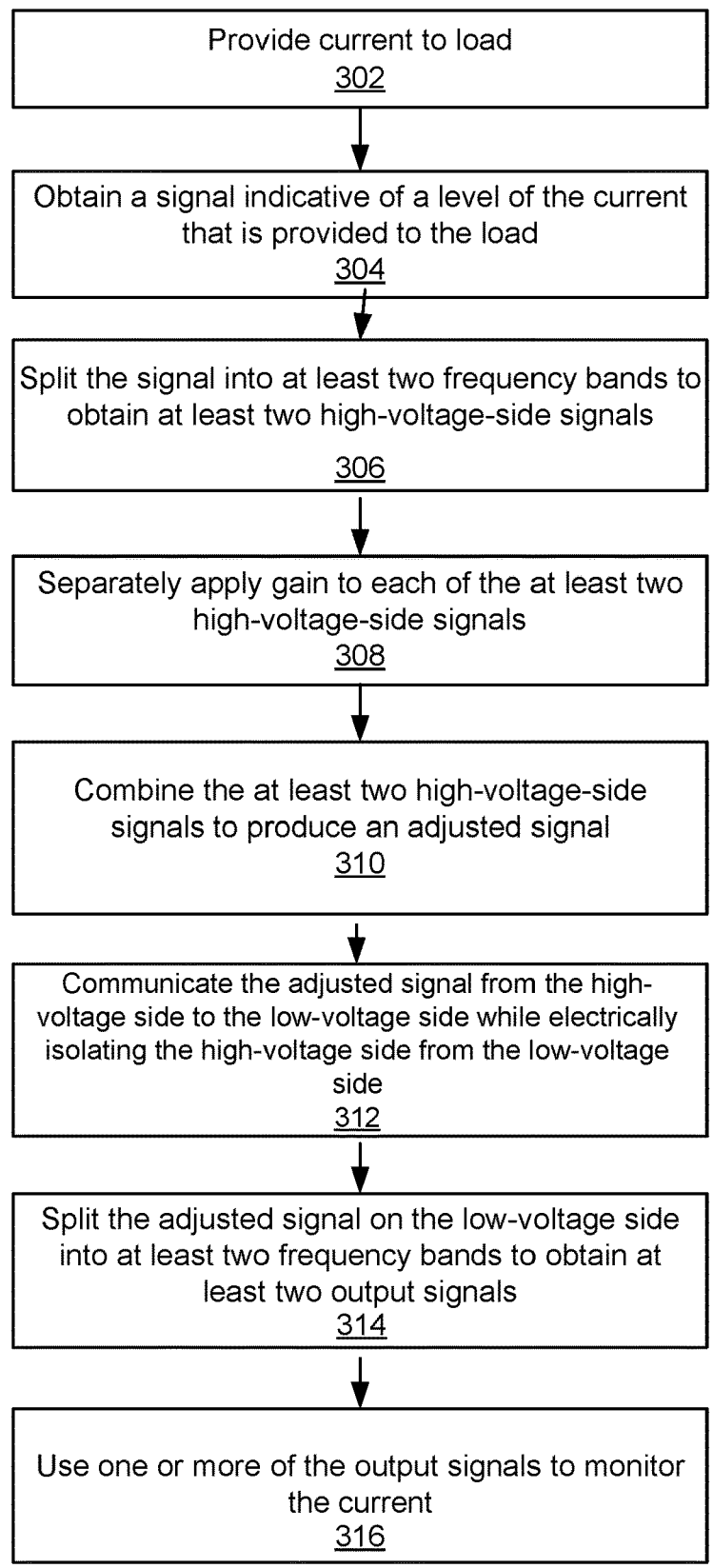
FIG. 3 is a flowchart depicting a method that may be traversed in connection with embodiments disclosed herein.

While referring to FIG. 2, simultaneous reference is made to FIG. 3, which is a flowchart depicting an exemplary method that may be traversed in connection with the embodiment depicted in FIG. 2. In operation, when a power source, such as the electrostatic chuck power supply 102, applies power to a load, such as the electrostatic chuck 104 (Block 302), the current through the shunt impedance, Z, will create a voltage signal at the v1 node, which is indicative of the level of current flowing through the shunt impedance, Z (Block 304). The voltage signal (also referred to herein more simply as a signal) is provided to the high-voltage-side band splitter 218 and then split into at least two frequency bands by the high-voltage-side band splitter 218 to obtain at least two high-voltage-side signals (Block 306). As depicted, the high-voltage-side band splitter 218 may include two or more filters and the gain component 222 may include the same number of gain amplifiers to produce two or more signals that are summed by the summer 224 to produce an adjusted voltage signal that is applied at the high voltage side of the isolation amplifier 226.

In the embodiment depicted in FIG. 2, the high-voltage side band splitter 218 includes two filters: a high pass filter 234 to pass frequencies of the signal above a first frequency (to obtain a first signal 238 for a first frequency band) and a low pass filter 236 to pass frequencies of the signal below a second frequency to obtain a second signal 240 for a second frequency band. In addition, the current monitor 203 depicted in FIG. 2 includes a first gain amplifier 242 to apply a first gain level to the first signal 238 and a second gain amplifier 244 to apply a second gain level to the second signal 240. As shown, the summer 224 is positioned and configured to combine the gain-adjusted first signal and the gain-adjusted second signal to produce an adjusted signal that is applied to the isolation amplifier 226.

In some implementations, the low pass filter 236 may pass DC information below 10 Hz and the high pass filter 234 may pass AC information above 100 Hz. In many implementations, the filtering is performed in the analog domain by any of a variety of analog filtering techniques such as Sallen-Key filtering, but other types of active filtering and/or passive filtering may be used. In some implementations, the high pass filter 234 and associated first gain amplifier 242 (gain=x amplifier) may be implemented as a single op-amp circuit and the low pass filter 236 and associated second gain amplifier 244 (gain=y amplifier) may be implemented as another op-amp circuit. It is also contemplated that the voltage signal at v1 may be converted to a digital signal and then filtered, digitally amplified, and summed in the digital domain. In other words, the high pass filter 234, the low pass filter 236, the first gain amplifier 242, the second gain amplifier 244, and the summer 224 may be realized by digital components.

Referring again to FIG. 3, gain is separately applied to the at least two high-side-voltage signals (Block 308). In the implementation depicted in FIG. 2, the first gain amplifier 242 that applies a gain equal to x is coupled to the high pass filter 234, and a second gain amplifier 244 with a gain equal to y is coupled to the low pass filter 236 (where x may be equal, or inequal, to y); thus, the DC information (e.g., below 10 Hz) and the AC information (e.g., above 100 Hz) may be separately amplified with different gain values.

In the context of the electrostatic chucking system 100, the separate amplification beneficially allows the higher-frequency band information (also referred to as AC current information) to be amplified to a much higher level to more accurately detect changes in AC current (which are indicative of changes in the capacitance of the workpiece 110 and electrostatic chuck 104). Moreover, the amplification of the constituent components of the voltage signal is beneficially performed before the isolation amplifier 226 so that gain in subsequent stages is not required and any noise produced by the isolation amplifier 226 is not amplified further.

As shown, the at least two high-voltage-side signals are combined by the summer 224 to produce an adjusted signal (Block 310). In the analog domain, the summer 224 may also be implemented as an op-amp as one of ordinary skill in the art will appreciate. The isolation amplifier 226 is then used to communicate the adjusted signal from the high-voltage side to the low-voltage side while electrically isolating the high-voltage side from the low-voltage side (Block 312). The isolation amplifier 226 operates to separate the low-voltage side from the high-voltage side by creating galvanic isolation as is known in the art. Beneficially, the isolation amplifier 226 separates the high-voltage-side of the current monitor 203 (operating with the floating ground) from the low-voltage side of the current monitor 203 (that operates with reference to earth ground); thus, protecting the low-voltage-side from damage.

As shown, the adjusted voltage signal on the low-voltage side (also referred to as a low-voltage-side combined signal) is split by the low-voltage-side band splitter 228 to obtain at least two low-voltage-side output signals (Block 314). The low-voltage-side band splitter 228 may mirror the high-voltage-side band splitter 218 with respect to the number of frequency bands that are used. As shown in FIG. 2, the low-voltage-side band splitter 228 includes a high pass filter 246 and a low pass filter 248, which may have the same frequency response as the high pass filter 234 and low pass filter 236, respectively, of the high-voltage-side band splitter 218. In addition, the high pass filter 246 and the low pass filter 248 on the low voltage side may, or may not, be implemented using the same technology as the high pass filter 234 and a low pass filter 236 on the high-voltage-filter side. Referring again to FIG. 3, the one or more of the at least two low-voltage-side output signals may be used to monitor the current through the conductor 216 (Block 316). And in the context of the electrostatic chucking system 100, the monitored higher frequency current (as indicated by the first output signal 230) may be used by the workpiece position module 107 to assess a position of the workpiece 110, and the monitored lower frequency current (as indicated by the second output signal) may be used to assess leakage current in the electrostatic chuck 104.

As an example of the overall method of the electrostatic chucking system 100, assume the DC current through the shunt impedance, Z, is 10 milliamps and the impedance of the shunt impedance, Z, is 100 ohms (without any reactive component), to produce 1 volt across the shunt impedance, Z. Further assume that the gain of y is set to be equal to 1.0 and the gain of x is set to equal 50.0. The low pass filter 236 will produce a voltage signal of 1 VDC and the corresponding second gain amplifier 244 will apply unity gain to produce 1 VDC. In turn, the isolation amplifier 226 will show 1 VDC as an output and the low pass filter 248 on the low-voltage-side will produce 1 VDC relative to earth ground.

With respect to the AC component (for calculating capacitance), assume a 1 kHz signal is inserted (e.g., by the electrostatic chuck power supply 102) to produce AC current of 1 kHz across the shunt impedance, Z. If a 1 milliamp peak-to-peak current is produced, the high pass filter 234 is going to "see" 100 millivolts AC on top of 1 VDC and pass 100 millivolts AC, which is amplified by 50 by the second gain amplifier 244 to produce a signal of 5 volts peak-to-peak. Given the output of the isolation amplifier 226 is +/−10 volts, the AC signal may be amplified to occupy a greater range of the isolation amplifier 226. At the output of the low-voltage-side there may be two signals: a 1 volt DC signal and a 5 volt AC peak-to-peak signal. Beneficially, the gains of the high-pass and low pass processing chains may be set so that when a maximum capacitive load is observed with the maximum DC current, the rails of the isolation amplifier 226 do not exceed specifications of the isolation amplifier 226 (so clipping does not occur). This capability contrasts with prior art approaches that simply allow a setting of volts per amp. Moreover, prior art systems employ gain amplification after an isolation amplifier, which amplifies the inherent noise of the isolation amplifier.

To detect a position of the workpiece 110 in the context of the electrostatic chucking system 100, the relationship between capacitance and positions of workpiece may be empirically determined, and threshold capacitances may be established that are indicative of, for example, the workpiece 110 in place or the workpiece 110 in clamp. The threshold capacitance values may be stored in nonvolatile memory in connection with workpiece position data to enable a mapping between capacitance values and workpiece position. The workpiece position module 107 may use the empirically obtained data in connection with the current measurements (e.g., higher frequency measurements obtained from the first output signal 230) to obtain a capacitance seen at the electrostatic chuck 104. As those of ordinary skill in the art readily appreciate, capacitance of a load may be determined based upon the time-varying AC voltage and current as follows:

$$I = C\frac{dV}{dt}.$$

Once the capacitance of the load (e.g., the combination of the electrostatic chuck 104 and the workpiece 110) is obtained, the position of the workpiece 110 may be obtained from nonvolatile memory.

The second output signal 232 beneficially provides an indication of low frequency current through the conductor 216, which typically provides an indication of a level of low frequency (e.g., below 10 Hz) leakage current in the electrostatic chuck 104. In many instances, the low frequency current (indicative of leakage current) may be below 1 Hz.

Figure 4:
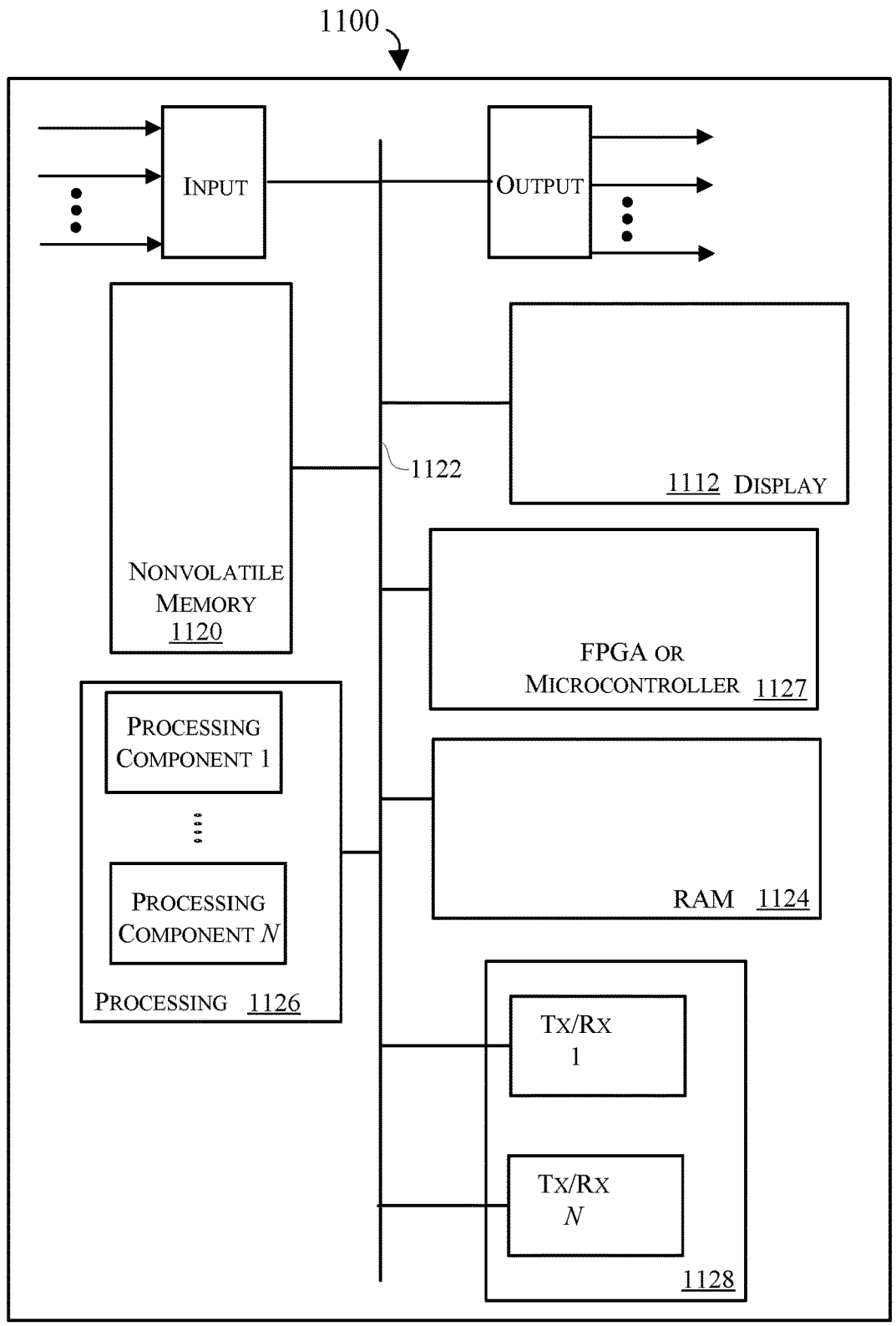
FIG. 4 is a block diagram depicting processing components that may be utilized in connection with embodiments disclosed herein.

As described above, the functions and methods described in connection with the embodiments disclosed herein may be effectuated utilizing hardware, in processor executable instructions encoded in non-transitory machine readable medium, or as a combination of the two. Referring to FIG. 4 for example, shown is a block diagram depicting physical components that may be utilized to realize one or more aspects of the high side current monitor 103 and its various embodiments (such as the current monitor 203). Moreover, the multiple instances of the computing device depicted in FIG. 4 may be implemented in the systems described herein. As shown, in this embodiment a display 1112 and nonvolatile memory 1120 are coupled to a bus 1122 that is also coupled to random access memory ("RAM") 1124, a processing portion (which includes N processing components) 1126, a field programmable gate array (FPGA) or microcontroller 1127, and a transceiver component 1128 that includes N transceivers. Although the components depicted in FIG. 4 represent physical components, FIG. 4 is not intended to be a detailed hardware diagram; thus, many of the components depicted in FIG. 4 may be realized by common constructs or distributed among additional physical components. Moreover, it is contemplated that other existing and yet-to-be developed physical components and architectures may be utilized to implement the functional components described with reference to FIG. 4.

The display 1112 generally operates to provide a user interface for a user, and in several implementations, the display 1112 is realized by a touchscreen display. For example, display 1112 can be implemented as a part of the high side current monitor 103 to enable a user to control gain settings of the first gain amplifier 242 and second gain amplifier 244 and/or time constants of the high pass filter 234 and low pass filter 236. The display 1112 may also be utilized as a part of the workpiece position monitor to display information about the position of the workpiece 110.

In general, the nonvolatile memory 1120 is non-transitory memory that functions to store (e.g., persistently store) data and machine readable (e.g., processor executable) code (including executable code that is associated with effectuating the methods described herein). In some embodiments, for example, the nonvolatile memory 1120 includes bootloader code, operating system code, file system code, and non-transitory processor-executable code to facilitate the execution of the methods described with reference to FIG. 3 described above. The nonvolatile memory 1120 may also be used to store empirically obtained data that relates workpiece position to capacitance data.

In many implementations, the nonvolatile memory 1120 is realized by flash memory (e.g., NAND or ONENAND memory), but it is contemplated that other memory types may also be utilized. Although it may be possible to execute the code from the nonvolatile memory 1120, the executable code in the nonvolatile memory is typically loaded into RAM 1124 and executed by one or more of the N processing components in the processing portion 1126.

In operation, the N processing components in connection with RAM 1124 may generally operate to execute the instructions stored in nonvolatile memory 1120 to realize the functionality of one or more components of embodiments of the high side current monitor 103 and/or the workpiece position module 107. As one of ordinary skill in the art will appreciate, the processing portion 1126 may include a video processor, digital signal processor (DSP), graphics processing unit (GPU), and other processing components. In digital implementations, a DSP may be used to effectuate the high pass filter 234, low pass filter 236, first gain amplifier 242, and second gain amplifier 244 depicted in FIG. 2.

In addition, or in the alternative, the field programmable gate array (FPGA) 1127 may be configured to effectuate one or more aspects of the functions and methodologies described herein. For example, non-transitory FPGA-configuration-instructions may be persistently stored in non-volatile memory 1120 and accessed by the FPGA 1127 (e.g., during boot up) to configure the FPGA 1127 to effectuate the functions of the current monitor 103.

If the computing device 1100 is implemented to realize the workpiece position module 107 (as a separate component from the high side current monitor 103), the input component may operate to receive signals (e.g., from the high side current monitor 103) that are indicative of the monitored current. The output component generally operates to provide one or more analog or digital signals to effectuate an operational aspect of components described herein. For example, if the computing device 1100 is implemented as a part of the high side current monitor 103, the output portion may transmit output signal(s) (e.g., first output signal 230 and second output signal 232) indicative of current levels to the workpiece position module 107.

The depicted transceiver component 1128 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A current monitor comprising:
a high-voltage side configured to obtain a signal indicative of current through a conductor, split the signal into a first and second signal, apply different levels of gain to the first signal and the second signal to produce a first gain-adjusted signal and a second gain-adjusted signal, respectively, and the high-voltage side is configured to combine the first gain-adjusted signal and a second gain-adjusted signal to produce an adjusted signal;
a low-voltage side electrically isolated from the high-voltage side and configured to split the adjusted signal to produce a plurality of output signals, each of the plurality of output signals is indicative of a level of current at one of a plurality of different frequency bands; and
an isolation amplifier configured to communicate the adjusted signal from the high-voltage side to the low-voltage side while electrically isolating the high-voltage side from the low-voltage side.

2. The current monitor of claim 1, wherein the high-voltage side is configured to obtain the signal by coupling-leads across a shunt impedance positioned in a current path of the conductor.

3. The current monitor of claim 1, wherein the high-voltage side is configured to obtain the signal from a Hall sensor positioned in a current path of the conductor.

4. The current monitor of claim 1 wherein the high-voltage side comprises:
a high-pass filter to pass frequencies of the signal above a first frequency to obtain the first signal for a first frequency band; and
a low pass filter to pass frequencies of the signal below a second frequency to obtain the second signal for a second frequency band.

5. The current monitor of claim 4, wherein the high-pass filter is configured to pass frequencies above 50 Hz and the low pass filter is configured to pass frequencies below 20 Hz.

6. The current monitor of claim 4, wherein the high-pass filter is configured to pass frequencies above 100 Hz and the low pass filter is configured to pass frequencies below 10 Hz.

7. The current monitor of claim 4 wherein the high-voltage side comprises:
a first gain amplifier to apply a first gain level to the first signal;
a second gain amplifier to apply a second gain level to the second signal; and
a summer to combine the first signal and the second signal to produce the adjusted signal.

8. The current monitor of claim 7, wherein the low-voltage side comprises:
a high-pass filter to pass frequencies of the adjusted signal above the first frequency to obtain a first one of the plurality of output signals; and
a low pass filter to pass frequencies of the adjusted signal below the second frequency to obtain a second one of the plurality of output signals.

9. The current monitor of claim 1 comprising a workpiece position module configured to receive at least one of the plurality of output signals and provide an indication of a position of a workpiece that is held in place by the current.

10. The current monitor of claim 1, wherein the isolation amplifier comprises one or more of optical, capacitive, and magnetic coupling to communicate the adjusted signal from the high-voltage side to the low-voltage side.

11. A method for monitoring current comprising:
obtaining a signal indicative of current through a conductor;
splitting the signal into at least two frequency bands to obtain at least two high-voltage-side signals;
separately applying gain to each of the at least two high-voltage-side signals;
combining the at least two high-voltage-side signals to produce an adjusted signal;
communicating the adjusted signal to a low-voltage-side via a galvanically isolated path;
splitting the adjusted signal on the low-voltage-side into at least two frequency bands to obtain at least two output signals, wherein the at least two frequency bands comprise a high frequency band and a low frequency band; and
using one or more of the at least two output signals to monitor the current in the conductor.

12. The method of claim 11 comprising:
monitoring the high frequency band to assess a capacitance of an electrostatic chuck.

13. The method of claim 12 comprising:
assessing the capacitance to determine a position of a workpiece.

14. A system for current monitoring comprising:
- a power supply configured to apply a voltage to an electrostatic chuck, the voltage comprising a direct current (DC) component and an alternating current (AC) component;
- a high-voltage-side band splitter configured to obtain a signal indicative of current through a conductor that couples the power supply to the electrostatic chuck and split the signal into at least two frequency bands to obtain at least two high-voltage-side signals;
- a gain component configured to separately apply gain to each of the at least two high-voltage-side signals;
- a summer configured to combine the at least two high-voltage-side signals to produce an adjusted signal;
- an isolation amplifier configured to communicate the adjusted signal to a low-voltage-side; and
- a low-voltage-side band splitter configured to split the adjusted signal on the low-voltage-side into at least two frequency bands to obtain at least two output signals indicative of components of the current in the conductor.

15. The system of claim 14 wherein the low-voltage-side band splitter is configured to produce a first output signal indicative of the AC component and a second output signal indicative of the DC component.

16. The system of claim 15 comprising:
- a workpiece position module configured to assess a position of a workpiece positioned on the electrostatic chuck by monitoring the first output signal indicative of the AC component and assess leakage current in the electrostatic chuck by monitoring the second output indicative of the DC component.

17. The system of claim 14, comprising at least one of a shunt resistor or a Hall sensor to obtain a signal indicative of current.

18. The system of claim 14, wherein the high-voltage-side band splitter comprises a high-pass filter configured to pass frequencies above 50 Hz and a low pass filter configured to pass frequencies below 20 Hz.

19. The system of claim 18, wherein the high-pass filter is configured to pass frequencies above 100 Hz and the low pass filter is configured to pass frequencies below 10 Hz.

* * * * *